United States Patent
Gao et al.

(10) Patent No.: US 11,760,883 B2
(45) Date of Patent: Sep. 19, 2023

(54) PREPARATION AND APPLICATION OF CUBE-LIKE ZNSNO$_3$ COMPOSITE COATED WITH HIGHLY GRAPHITIZED FINE ASH

(71) Applicants: Institute of Energy, Hefei Comprehensive National Science Center, Hefei (CN); AnHui University of Science and Technology, Huainan (CN)

(72) Inventors: Shengtao Gao, Huainan (CN); Yuanchun Zhang, Huainan (CN); Chengli Wu, Huainan (CN); Hanxu Li, Huainan (CN)

(73) Assignees: AnHui University of Science and Technology, Huainan (CN); Institute of Energy, Hefei Comprehensive National Science Center, Hefei (CN)

( * ) Notice: Subject to any disclaimer, the term of this patent is extended or adjusted under 35 U.S.C. 154(b) by 136 days.

(21) Appl. No.: 17/341,423

(22) Filed: Jun. 8, 2021

(65) Prior Publication Data

US 2022/0119644 A1    Apr. 21, 2022

(30) Foreign Application Priority Data

Oct. 15, 2020    (CN) .......................... 202011104295.9

(51) Int. Cl.
```
C09C 1/04      (2006.01)
C09C 3/06      (2006.01)
H05K 9/00      (2006.01)
```

(52) U.S. Cl.
CPC ................ *C09C 1/04* (2013.01); *C09C 3/063* (2013.01); *H05K 9/0081* (2013.01); *C01P 2002/72* (2013.01); *C01P 2002/82* (2013.01); *C01P 2002/85* (2013.01); *C01P 2004/03* (2013.01); *C01P 2004/04* (2013.01); *C01P 2004/38* (2013.01); *C01P 2004/80* (2013.01)

(58) Field of Classification Search
None
See application file for complete search history.

(56) References Cited

U.S. PATENT DOCUMENTS 6,705,385 B2    3/2004    Ray et al.
9,190,660 B2    11/2015   Takemoto et al.
9,997,764 B2    6/2018    Spahr et al.

*Primary Examiner* — Tanisha Diggs
(74) *Attorney, Agent, or Firm* — True Shepherd LLC; Andrew C. Cheng (57) ABSTRACT

A preparation method of a cube-like ZnSnO$_3$ composite coated with highly graphitized fine ash comprises steps: S1: with the gasified fine slag of pulverized coal as a raw material, preparing the fine ash by adopting a three-step acidification method; and S2: adding the fine ash prepared in the S1 into a container filled with distilled water, ultrasonically dispersing for 20-40 min, adding equal molar masses of SnCl$_4$·5H$_2$O and (Zn(NO$_3$)$_2$·6H$_2$O respectively, uniformly stirring, dropwise adding ammonia into the mixed solution and magnetically stirring until the pH value of the mixed solution is 12, heating the mixed solution, washing the product obtained with deionized water and ethanol for 2-4 times, and finally drying to obtain a ZnSnO$_3$@fine composite. With the dielectric property and conductivity adjusted, the composite prepared reveals a good impedance matching performance and an improved MA performance.

9 Claims, 6 Drawing Sheets

PREPARATION AND APPLICATION OF CUBE-LIKE ZNSNO₃ COMPOSITE COATED WITH HIGHLY GRAPHITIZED FINE ASH

CROSS-REFERENCE TO RELATED APPLICATIONS

This application claims priority to Chinese Patent Application No. 202011104295.9 with a filing date of Oct. 15, 2020. The content of the aforementioned application, including any intervening amendments thereto, is incorporated herein by reference.

TECHNICAL FIELD

The present invention relates to the technical field of composites, in particular to a preparation and application of a cube-like $ZnSnO_3$ composite coated with highly graphitized fine ash.

BACKGROUND

Fine ash is a new type of solid waste and by-product produced in the process of coal gasification, only a small portion of fine ash is used currently, while the rest is simply dumped, causing environmental pollution. To achieve the "zero emission" of coal gasification technology, the management and development work on the environmentally safe utilization of by-products is a top priority.

SUMMARY OF THE INVENTION

According to the technical problems existing in the background art, the present invention provides a preparation and application of a cube-like $ZnSnO^3$ composite coated with highly graphitized fine ash. With the dielectric property and conductivity adjusted, the prepared composite reveals a good impedance matching performance and an improved MA performance.

The present invention provides a method for preparing a cube-like $ZnSnO^3$ composite coated with highly graphitized fine ash, comprising the following method steps:

S1: preparing fine ash
with the gasified fine slag of pulverized coal as a raw material, preparing the fine ash by adopting a three-step acidification method;

S2: synthesizing a $ZnSnO_3$@fine ash composite
adding the fine ash prepared in the S1 into a container filled with distilled water, ultrasonically dispersing for 20-40 min, adding equal molar masses of $SnCl_4·5H_2O$ and $(Zn(NO_3)_2·6H_2O$ respectively, uniformly stirring, dropwise adding ammonia into the mixed solution and magnetically stirring until the pH value of the mixed solution is 12, heating the mixed solution, washing the product obtained with deionized water and ethanol for 2-4 times, and finally drying to obtain a $ZnSnO_3$@fine composite.

Preferably, the fine ash is prepared in the following method steps:

S11: with the gasified fine slag of pulverized coal as a raw material, mixing with hydrochloric acid solution in a container, stirring and filtering;

S12: washing the solid filtered in the S11 to neutral with water, and drying;

S13: mixing the solid dried in the S12 with hydrofluoric acid solution in a container, stirring, filtering, washing to neutral with water, and drying; and S14: mixing the solid dried in the S13 with hydrochloric acid solution in a container, stirring, filtering, washing to neutral with water, and drying to obtain fine ash.

Preferably, the concentration of the hydrochloric acid solution is 5 mol/L, and the mass-to-volume ratio of the gasified fine slag to the hydrochloric acid solution is 1 g:(8-12) mL in the S11.

Preferably, the mass fraction of the hydrofluoric acid solution is 40%, and the mass-to-volume ratio of the gasified fine slag to the hydrofluoric acid solution is 1 g:(8-12) mL in the S13.

Preferably, the mixing temperature is all 50-70° C. in the S11, the S13 and the S14.

Preferably, the drying condition is drying at 100-110° C. for 10-14 h in the S12, the S13 and the S14.

Preferably, the mass molar ratio of the fine ash, $SnCl_4·5H_2O$ and $(Zn(NO_3)_2·6H_2O$ is 1 mg:0.0125-0.0375 mol:0.0125-0.0375 mol in the step S2.

Preferably, the reaction condition is reacting at 140-160° C. for 8-12 h in the S2.

Preferably, the drying condition is vacuum drying at 50-70° C. for 10-14 h in the S2.

The present invention also provides an application of a cube-like $ZnSnO_3$ composite coated with highly graphitized fine ash prepared according to the above method in microwave absorption.

Compared with the prior art, the present invention has the following advantageous effects:

According to the present invention, a $ZnSnO^3$@ fine ash (ZSFA) absorbing material with a special core-shell structure is successfully prepared by coating the self-assembled $ZnSnO_3$ with highly graphitized fine ash based on the hydrothermal reaction method. With the dielectric property and conductivity adjusted, the prepared ZSFA composite reveals a good impedance matching performance and an improved MA performance. With 50% (wt %) added, the synthesized ZSFA-2 show the strongest dielectric loss capability with a maximum RL value of −47.8 dB at 2.5 mm. The widest effective absorption bandwidth can reach 7.0 GHz, or range from 11.0 GHz to 18.0 GHz when the thickness is only 2.0 mm. The relevant electromagnetic properties and dielectric loss capability are also discussed in detail. The ZSFA composite has a tunable dielectric loss behavior and a broadband MA capability due to strong dielectric polarization and multi-dielectric polarization, suitable conductivity and special electron migration route.

DETAILED DESCRIPTION OF THE PREFERRED EMBODIMENT

The present invention will be further described in combination with specific embodiments.

$SnCl_4·5H_2O$, $Zn(NO_3)_2·6H_2O$ and $NH_3·H_2O$ used herein are all analytically pure and purchased from Sinopharm Holdings Chemical Reagent Co. Ltd.

Example 1

The present invention provides a method for preparing a cube-like $ZnSnO^3$ composite coated with highly graphitized fine ash, comprising the following method steps:

S1: preparing fine ash with the gasified fine slag of pulverized coal as a raw material, preparing the fine ash by adopting a three-step acidification method; with the specific steps as follows:

S11: with 50 g of the gasified fine slag of pulverized coal as a raw material, mixing with 500 ml of hydrochloric acid solution (5 mol/L) in a container, stirring and filtering;

S12: washing the solid filtered in the S11 to neutral with water, and drying;

S13: mixing the solid dried in the S12 with 500 ml of hydrofluoric acid solution (40%, wt %) in a container, stirring, filtering, washing to neutral with water, and drying; and S14: mixing the solid dried in the S13 with 500 ml of hydrochloric acid solution (1.19 g/mL) in a container, stirring, filtering, washing to neutral with water, and drying to obtain fine ash.

The mixing temperature is all 60° C. in the S11, the S13 and the S14.

The drying condition is drying at 105° C. for 12 h in the S12, the S13 and the S14.

S2: synthesizing a $ZnSnO_3$@fine ash composite adding 40 mg of the fine ash prepared in the S1 into a container filled with 30 ml of distilled water, ultrasonically dispersing for 30 min, adding 0.5 mol of $SnCl_4·5H_2O$ and 0.5 mol of $(Zn(NO_3)·6H_2O$ respectively, uniformly stirring for about 30 min, dropwise adding ammonia (25%) into the mixed solution and magnetically stirring until the pH value of the mixed solution is 12, heating the mixed solution, washing the product obtained with deionized water and ethanol for 3 times, and finally drying to obtain a $ZnSnO_3$@fine ZSFA-1.

The reaction condition is reacting at 140° C. for 8 h in the S2.

The drying condition is vacuum drying at 50° C. for 10 h in the S2.

Example 2

The present invention provides a method for preparing a cube-like $ZnSnO^3$ composite coated with highly graphitized fine ash, comprising the following method steps:

S1: preparing fine ash with the gasified fine slag of pulverized coal as a raw material, preparing the fine ash by adopting a three-step acidification method; with the specific steps as follows:

S11: with 50 g of the gasified fine slag of pulverized coal as a raw material, mixing with 500 ml of hydrochloric acid solution (5 mol/L) in a container, stirring and filtering;

S12: washing the solid filtered in the S11 to neutral with water, and drying;

S13: mixing the solid dried in the S12 with 500 ml of hydrofluoric acid solution (40%, wt %) in a container, stirring, filtering, washing to neutral with water, and drying; and S14: mixing the solid dried in the S13 with 500 ml of hydrochloric acid solution (1.19 g/mL) in a container, stirring, filtering, washing to neutral with water, and drying to obtain fine ash.

The mixing temperature is all 60° C. in the S11, the S13 and the S14.

The drying condition is drying at 105° C. for 12 h in the S12, the S13 and the S14.

S2: synthesizing a $ZnSnO_3$@fine ash composite adding 40 mg of the fine ash prepared in the S1 into a container filled with 30 ml of distilled water, ultrasonically dispersing for 30 min, adding 1.0 mol of $SnCl_4·5H_2O$ and 1.0 mol of $(Zn(NO_3)·6H_2O$ respectively, uniformly stirring for about 30 min, dropwise adding ammonia (25%) into the mixed solution and magnetically stirring until the pH value of the mixed solution is 12, heating the mixed solution, washing the product obtained with deionized water and ethanol for 3 times, and finally drying to obtain a $ZnSnO_3$@fine ZSFA-2.

The reaction condition is reacting at 150° C. for 10 h in the S2.

The drying condition is vacuum drying at 60° C. for 12 h in the S2.

Example 3

The present invention provides a method for preparing a cube-like $ZnSnO^3$ composite coated with highly graphitized fine ash, comprising the following method steps:

S1: preparing fine ash with the gasified fine slag of pulverized coal as a raw material, preparing the fine ash by adopting a three-step acidification method; with the specific steps as follows:

S11: with 50 g of the gasified fine slag of pulverized coal as a raw material, mixing with 500 ml of hydrochloric acid solution (5 mol/L) in a container, stirring and filtering;

S12: washing the solid filtered in the S11 to neutral with water, and drying;

S13: mixing the solid dried in the S12 with 500 ml of hydrofluoric acid solution (40%, wt %) in a container, stirring, filtering, washing to neutral with water, and drying; and S14: mixing the solid dried in the S13 with 500 ml of hydrochloric acid solution (1.19 g/mL) in a container, stirring, filtering, washing to neutral with water, and drying to obtain fine ash.

The mixing temperature is all 60° C. in the S11, the S13 and the S14.

The drying condition is drying at 105° C. for 12 h in the S12, the S13 and the S14.

S2: synthesizing a ZnSnO₃@fine ash composite adding 40 mg of the fine ash prepared in the S1 into a container filled with 30 ml of distilled water, ultrasonically dispersing for 30 min, adding 1.5 mol of SnCl₄·5H₂O and 1.5 mol of (Zn(NO₃)·6H₂O respectively, uniformly stirring for about 30 min, dropwise adding ammonia (25%) into the mixed solution and magnetically stirring until the pH value of the mixed solution is 12, heating the mixed solution, washing the product obtained with deionized water and ethanol for 3 times, and finally drying to obtain a ZnSnO₃@fine ZSFA-3.

The reaction condition is reacting at 160° C. for 12 h in the S2.

The drying condition is vacuum drying at 70° C. for 14 h in the S2.

The chemical composition, structure and morphology of the ZSFA composite prepared by the present invention are characterized by an x-ray diffractometer (LabX XRD-6000, Shimadzu, Japan), a laser confocal Raman spectrometer (Renishaw-2000, Renishaw, UK), an x-ray photoelectron spectrometer (ESCALABMK-II, Thermo Fisher Scientific Inc, USA), a field emission scanning electron microscope (FEI Sirion 2000, FEI Co., Netherlands), and a transmission electron microscope (JEOL-2010, Japan Electronics Co. Ltd., Japan). The relevant electromagnetic parameters are tested by a vector network analyzer (AV 3629D, CETC 41$^{st}$ Institute, China) from 2 to 18 GHz. The particulate composite is mixed with paraffin wax at a mass ratio of 1:1 and pressed into coaxial ring (outer diameter: 7.00 mm, inner diameter: 3.04 mm) to study its absorption performance.

Figure 1:
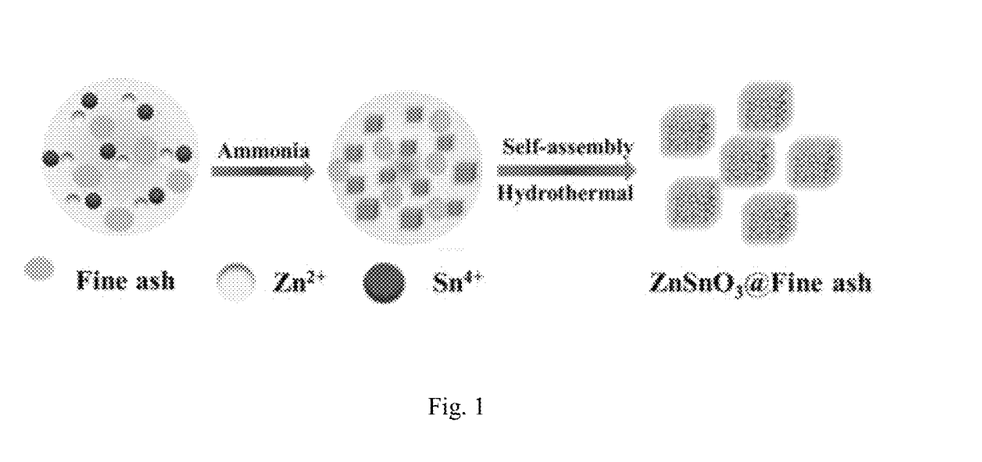
FIG. 1 shows the synthesis process of a cube-like $ZnSnO_3$ composite coated with highly graphitized fine ash provided by the present invention.

Compared with other carbon materials, the fine ash prepared by the present invention can be used without further modification. In the synthesis process of the ZSFA composite, firstly, the defect sites and negatively charged functional groups of the fine ash can attract $Zn^{2+}$ and $Sn^{4+}$ ions through strong electrostatic interaction; secondly, with the additive ammonia as precipitant, stannic hydroxide and zinc hydroxide are generated and attached to the surface of the fine ash; and finally, self-assembled $ZnSnO_3$ is coated by fine ash particles to form the final ZnSnO₃@. The specific synthesis process is shown in FIG. 1.

Figure 2:
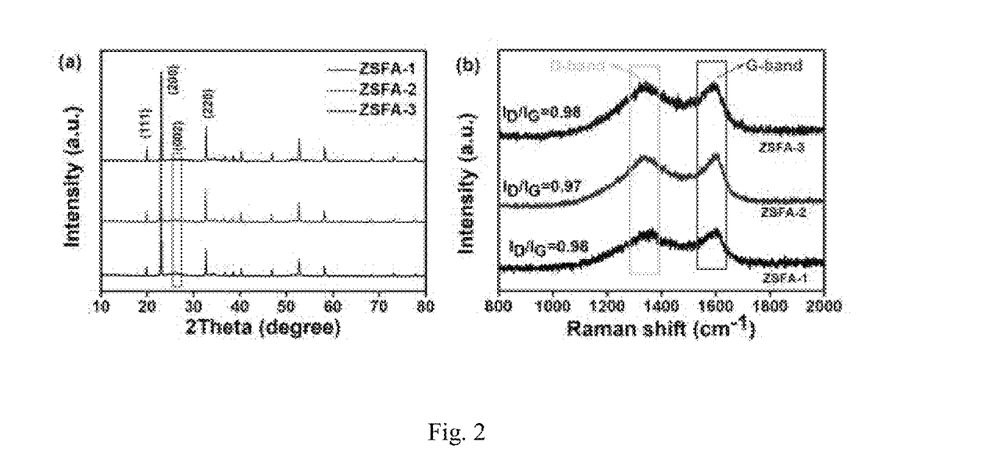
In FIG. 2, (a) is the XRD spectrum of the ZSFA composite, and (b) is the Raman spectrum of the ZSFA composite.

The chemical composition, crystal structure and degree of graphitization of the ZSFA composite are characterized by XRD and Raman, with the results shown in FIG. 2. In FIG. 2 (a), the three series of composites have distinct diffraction peaks, and the formed $ZnSnO_3$ exhibits high diffraction intensity due to good crystal integrity. The main high intensity diffraction peaks are attributed to the $ZnSnO^3$ crystals with 2θ equal to 19.6°, 22.8°, 32.4°, 40.1°, 46.6°, 52.4°, and 57.6°, respectively, which are consistent with the positions corresponding to standard $ZnSnO_3$ crystallographic planes (JCPDS:11-0274) (111), (200), (220), (222), (400), (420), and (422). Furthermore, some broad peaks appear at 2θ=26°, which is consistent with the (002) plane of graphitized carbon. In addition, no other diffraction peaks appear in the XRD spectrum, indicating the high purity of the synthesized ZSFA composite. The band states of carbon atoms in the ZSFA composite are examined by a Raman spectrometer, and typical D and G peaks are found (FIG. 2 (b)). Usually, the D peak represents defective or disordered carbon components and the G peak represents sp2 hybridized graphitized carbon. The intensity ratio of D-band and G-band (ID/IG) is used as a criterion to evaluate the banding state, indicating the electron mobility. The ID/IG values of ZSFA-1, ZSFA-2 and ZSFA-3 are 0.98, 0.97 and 0.98, respectively, indicating that the growth of $ZnSnO_3$ had undergone a solvothermal process (solvothermal synthesis method) without any impact on the structural stability of fine ash.

Figure 3:
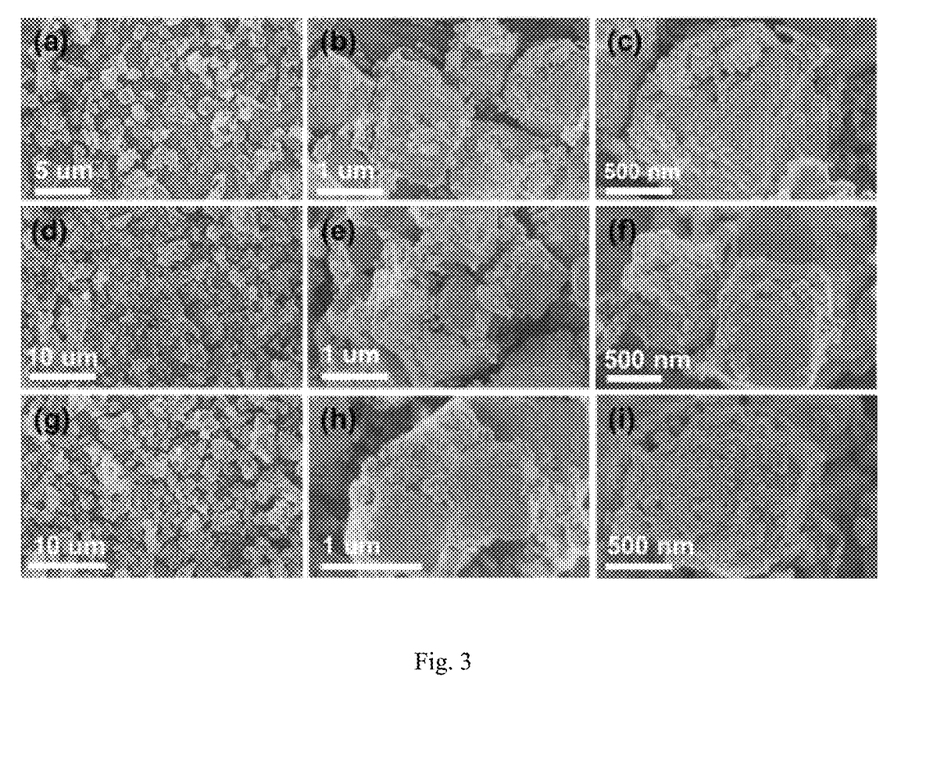
In FIG. 3, (a), (b) and (c) are SEM images of the composite prepared in Example 1, (d), (e) and (f) are SEM images of the composite prepared in Example 2, (g), (h) and (i) are SEM image of the composite prepared in Example 3.
Figure 4:
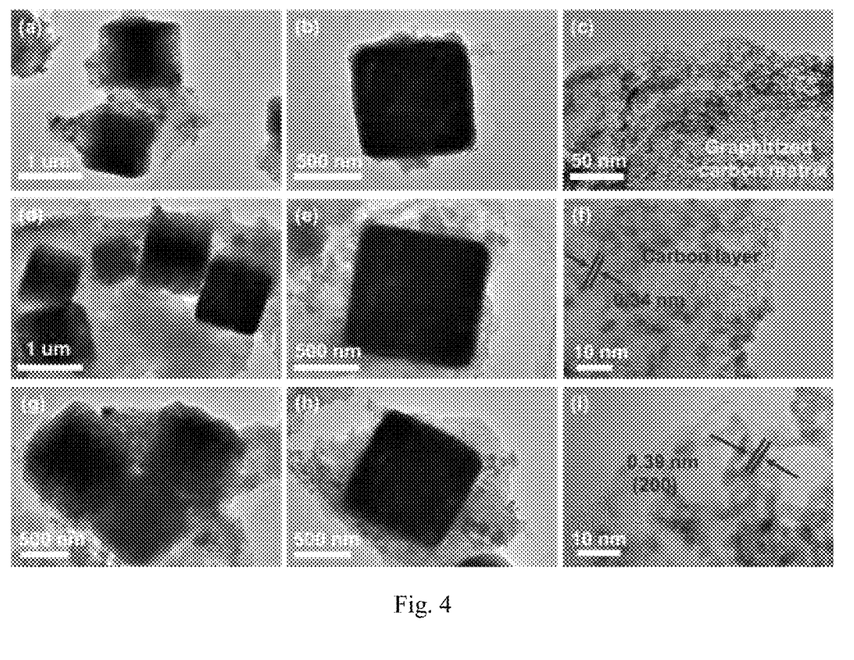
In FIG. 4, (a), (b) and (c) are TEM images of the composite prepared in Example 1, (d), (e) and (f) are TEM images of the composite prepared in Example 2, (g), (h) and (i) are TEM image of the composite prepared in Example 3.

The morphology and microstructure of the composites ZSFA-1, ZSFA-2 and ZSFA-3 are analyzed by scanning electron microscopy (SEM) and transmission electron microscopy (TEM), respectively; as shown in FIG. 3, the cube-like $ZnSnO_3$ is tightly coated by a large number of fine ash nanoparticles, forming the ZSFA-1 composite with a core-shell structure (FIG. 3 (a), (b), (c)). Similarly, $ZnSnO_3$ is embedded through the interaction between chemical bonds and graphitized fine ash in the self-assembly process, which is beneficial to establishing a connection interface of ZSFA-2 (FIG. 3 (d), (e), (f)). However, with the increase of $ZnSnO_3$ content, i.e., excessive $Zn^{2+}$ and $Sn^{4+}$, some monodisperse $ZnSnO_3$ cubes are exposed on the smooth surface in ZSFA-3. The TEM images show that the ZSFA composite with $ZnSnO_3$ as the core and the fine ash as the shell has a distinct core-shell structure (FIG. 4 (a), (b)), while some $ZnSnO_3$ nanoparticles are anchored on the graphitic carbon matrix, forming nanoscale heterojunctions (FIG. 4 (c)). The nanocrystalline $ZnSnO_3$ is assembled into cube-like particles with a size of about 0.51 μm (FIG. 4 (d), (e)), and the interlayer distance of about 0.34 nm in the high-resolution TEM images indicates a typical graphitized carbon structure (FIG. 4 (f)), with the graphitized carbon derived from fine ash. In FIG. 4 (g), (h), the obtained $ZnSnO_3$ is not solid, and there are some gaps and block defects in the cubic structure. In FIG. 4 (i), the lattice spacing of 0.39 nm is the (200) plane of $ZnSnO_3$ composite. Therefore, the above results confirm the successful preparation of the ZSFA composite with unique core-shell structure and stable structure.

Figure 5:
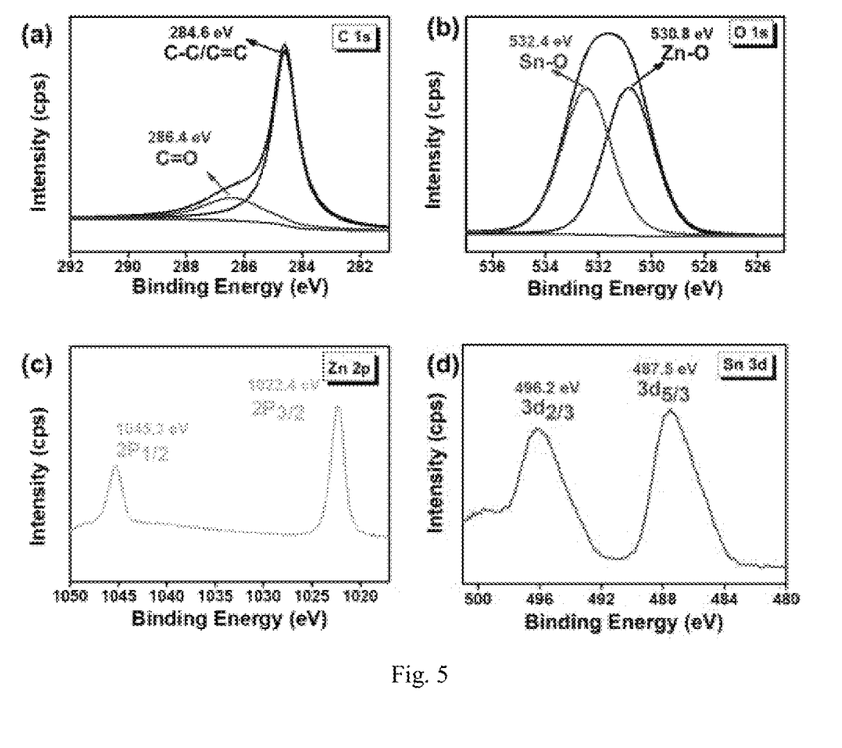
FIG. 5 shows the XPS spectra of the composites prepared in Example 2, where (a) C 1s, (b) O 1s, (C) Zn 2p, and (d) Sn 3d.

To investigate the chemical environment and valence state of elements, the prepared ZSFA-2 is characterized by XPS. The results show that the composites possess the elements Zn, Sn, O and C corresponding to $ZnSnO_3$ and fine ash, respectively. In FIG. 5, (a) is a high-resolution C 1s spectrum with two peaks at 284.6 eV and 286.4 eV, which belong to the binding energy of C—C/C=C and C=O, respectively. In the O 1s spectrum, there are two split peaks at 532.4 eV and 530.8 eV, which belong to typical Sn—O and Zn—O, respectively (FIG. 5 (b)). The spectrum of Zn 2p can be decomposed into two peaks at 1045.3 eV and 1022.4 eV, and the splitting energy between Zn 2p3/2 and Zn 2p1/2 is calculated to be 22.9 eV, indicating the presence of $Zn^{2+}$ ions in the $ZnSnO^3$ composite (FIG. 5 (c)). In FIG. 5 (d), two main peaks of 496.2 eV and 487.5 eV in Sn 3d spectrum are Sn3d3/2 and Sn 3d5/2, respectively. The obtained results confirm the successful preparation of the ZSFA composites based on XPS analysis and XRD characteristics.

Figure 6:
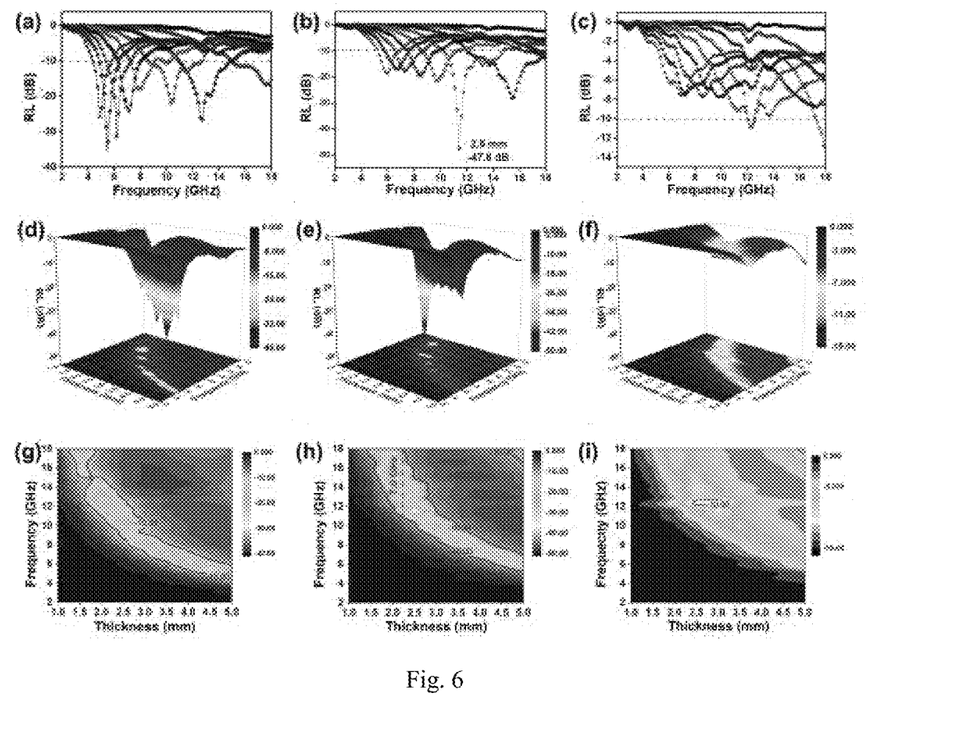
In FIG. 6, (a), (d) and (g) show the reflection loss and effective absorption broadband of the composite prepared in Example 1, (b), (e) and (h) show the reflection loss and effective absorption broadband of the composite prepared in Example 2, (c), (f) and (I) show the reflection loss and effective absorption broadband of the composite prepared in Example 3.

As a functional material, excellent MA composites should have strong energy conversion ability, wide absorption frequency and thin application thickness. For the synthesized ZSFA, the reflection loss (RL≤−10 db) and the effective absorption bandwidth (EABD, RL≤−10 db) are the main criteria for evaluating MA performance (FIG. 6). According to the transmission line theory, the relevant RL data can be calculated by the following equations:

$$Z_{in} = Z_0 \sqrt{(\mu_r/\varepsilon_r)} \tanh\left[j\left(\frac{2\pi fd}{c}\right)\sqrt{\mu_r \varepsilon_r}\right] \quad (1)$$

-continued $$RL = 20\log|(Z_{in} - Z_0)/(Z_{in} + Z_0)| \quad (2)$$

$Z_0$ is free space impedance, $Z_{in}$ is input impedance, $\varepsilon_r$ is a complex dielectric constant, $\mu_r$ is a complex permeability, f is the recent GHz frequency test, d is the test thickness, c is the microwave speed in free space, and $Z_{in}$ is input impedance.

For ZSFA-1, with the increase of thickness, the maximum absorption RL peak shifts from high frequency region to low frequency region, and the RL values in the thickness range of 1-5 mm are −2.9, −17.0, −27.2, −21.8, −18.6, −24.0, −31.2, −35.6 and −25.7, respectively (FIG. 6 (a)). It is clear that ZSFA-1 reveals the highest loss capability at 4.5 mm thickness, and its EABD also shows a changing trend, with the widest EABD up to 4.0 GHz at 2.0 mm and up to 5.1 GHz at 1.8 mm (FIG. 6 (g)). The dielectric properties (MA) of ZSFA-2 are improved with increasing $ZnSnO_3$ content. When the mass addition of ZSFA-2 is 50%, the strongest RL value of ZSFA-2 reaches −47.7 dB at 2.5 mm, exhibiting strong dielectric loss capability (FIG. 5 (b)). Meanwhile, the widest EABD (RL≤−10 dB) can cover 7.1 GHz, ranging from 10.9 GHz to 18.0 GHz; and the EABD can cover the entire Ku band with a thickness of only 2.0 mm (FIG. 6 (h)). Similarly, the MA peak shifts from the high frequency region to the low frequency region, which satisfies the frequency-dependent characteristics. However, due to the poor electrical conductivity, excessive $ZnSnO_3$ component in ZSFA-3 severely disrupts the impedance matching, making it difficult to achieve the strong MA criterion and the effective absorption band even if the thickness is adjusted properly (FIG. 6 (c), (i)). Therefore, compared with the composites ZSFA-1 and ZSFA-3, ZSFA-2 promotes MA in both microwave energy loss and wider EABD area at a certain test thickness (FIG. 6 (d), (e), (f)).

Figure 7:
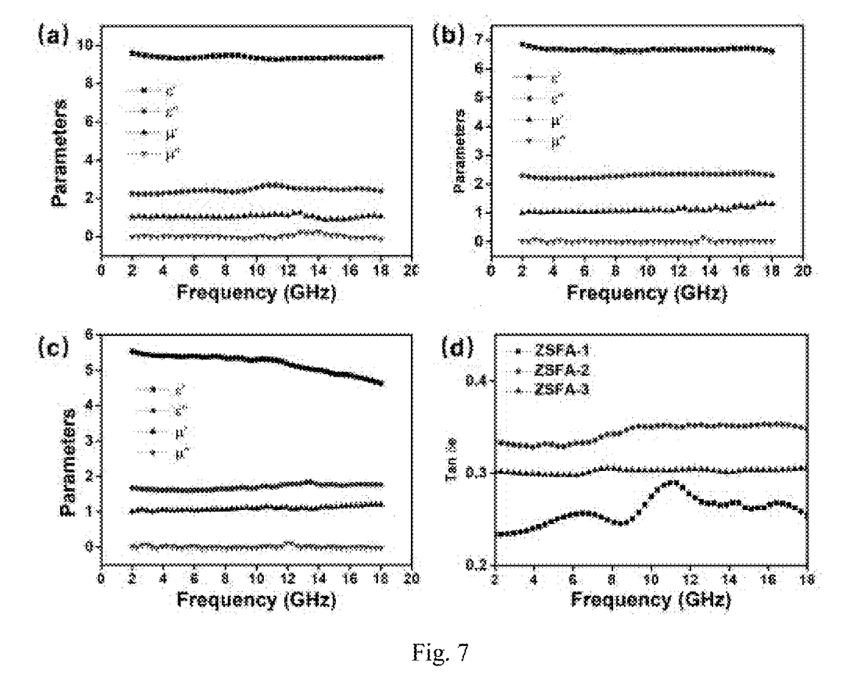
In FIG. 7, (a), (b) and (c) show the electromagnetic parameters of the composite prepared in Examples 1-3, and (d) shows the dielectric loss tank of the composite.

According to the microwave absorption theory, the microwave absorption capacity is closely related to the intrinsic electromagnetic properties reflected by the electromagnetic parameters. The complex dielectric constant ($\varepsilon_r=\varepsilon'-j\varepsilon''$) and complex permeability ($\mu_r=\mu'-j\mu''$) exhibit frequency-dependent characteristics at 2-18 GHz, as shown in FIG. 7. According to the electromagnetic theory, the real part and the imaginary part represent the storage capacity and loss capacity of incident microwave energy, respectively. As shown in FIG. 7 (a), the value of the real part of the complex dielectric constant decreases from 9.6 to 9.4 in the range of 2-18 GHz, and the value of the imaginary part of the dielectric constant of ZSFA-1 increases slightly from 2.2 to 2.4 in the measurement frequency range. For ZSFA-2, the range of the real part ε value decreases from 6.9 to 6.6, and the imaginary part ε'' value is kept at 2.3 with the increase of frequency (FIG. 7 (b)). ZSFA-3 has the worst energy storage and loss capacity, with the ε value up to 5.5 only and the ε'' value below 2 (FIG. 7 (c)). The ZSFA composites all have general complex permeability, indicating that dielectric loss plays a dominant role in the microwave absorption process. ZSFA-1 and ZSFA-2 have high electromagnetic parameters, high loss capability and efficient energy conversion behavior compared with ZSFA-3. In FIG. 7, (d) is the tangent value of dielectric loss, which further provides a basis for discussing the mechanism of MA.

The composites ZSFA-1 and ZSFA-2 exhibit excellent wave absorption performance, strong RL capability and wide absorption characteristics, which meet the requirements of modern MA materials. According to Debye's theory, the real part of the complex dielectric constant represents the storage capacity of the ZSFA absorbing material for the incident electromagnetic wave energy, which determines the upper storage limit of the material. It can be known from Equations (4) and (5) that the imaginary part reflects the dissipation capacity of ZSFA composites and is proportional to the intrinsic conductivity.

$$\varepsilon' = \varepsilon_\infty + \frac{\varepsilon_s - \varepsilon_\infty}{1 + \omega^2\tau^2} \quad (3)$$

$$\varepsilon'' = \varepsilon_p'' + \varepsilon_0'' = \frac{\varepsilon_s - \varepsilon_\infty}{1 + \omega^2\tau^2}\omega\tau + \frac{\sigma}{\omega\varepsilon_0} \quad (4)$$

Figure 8:
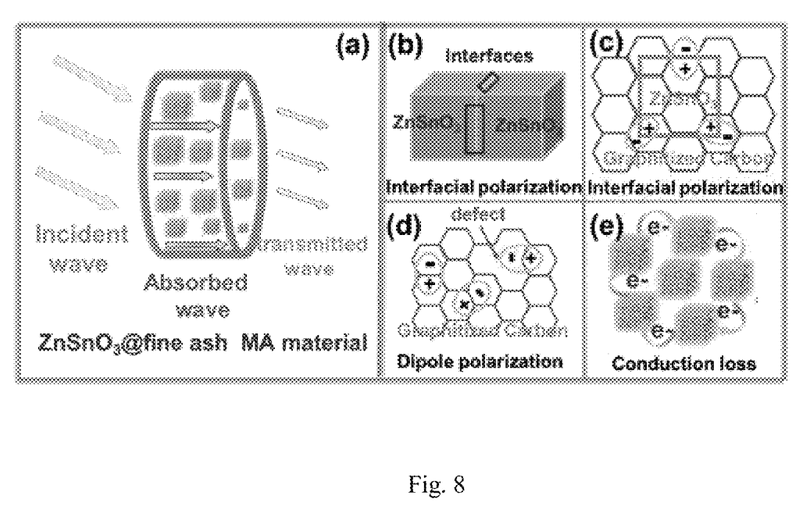
In FIG. 8, (a) is a schematic diagram illustrating microwave absorption of composite, (b) is a schematic diagram illustrating enhanced dipole polarization of the interface, (c) is a schematic diagram illustrating the dissipation of incident microwave energy, (d) is a schematic diagram illustrating dipole polarization, and (e) is a diagram illustrating electron movement.

Where, $\varepsilon_S$ is a static dielectric constant, $\varepsilon_\infty$ is a dielectric constant at the limiting frequency, σ is intrinsic conductivity of absorbing material, ω is angular frequency, and τ is polarization relaxation time ($\omega\tau=2\pi f$). To be sure, the enhancement of polarization moments and electron mobility in the synthesized ZSFA composites leads to an increase in the dielectric loss capability. FIG. 8 shows a large number of contact interfaces, including heterojunction regions and heterojunction regions. For the self-assembly of $ZnSnO_3$, a large number of cube-like $ZnSnO_3$ nanocrystals are formed into large-size bulk materials after the Ostwald ripening reaction. Under the action of electromagnetic field, the positive and negative charges around the $ZnSnO_3$—$ZnSnO_3$ interface will deviate from its geometric center, forming enhanced interface polarization (FIG. 8 (b)). The polarization moment at the homojunction interface lags behind the high frequency field, forming an enhanced interfacial polarization. Similarly, the heterojunction region in $ZnSnO_3$ graphitized carbon can excite a strong polarization relation to dissipate the incident microwave energy (FIG. 8 (c)). Two types of $ZnSnO_3$-fine ash contacts occur; i.e. the region where the cube-like $ZnSnO_3$ core is attached to the adjacent carbon shell, and the interface of $ZnSnO_3$ nanoparticles modified on the graphitized carbon matrix. These enhanced polarization behaviors occurring at the interface facilitate the increase of ε'' values and promote the conversion of microwave energy into thermal energy.

The conductivity loss plays an equally important role in enhancing electron migration, and is beneficial to the MA process. The ballistic transport of charge electrons in the fine ash enhances its electrical conductivity under the action of a high frequency electric field. In addition, there are some defective and oxygen-containing functional groups in the fine ash carbon, resulting in abundant dipoles. The geometric center of the charge deviates from the original equilibrium point, leading to dipole polarization (FIG. 8 (d)). The above behavior contributes to the excellent MA performance.

ZSFA-2 is a high-performance functional material with the best MA capacity, strong RL value (−47.7 dB, 2.5 mm) and tuning absorption frequencies from c-band and x-band to Ku-band. The EABD coverage of ZSFA-2 is 7.1 GHz, ranging from 10.9 to 18.0 GHz at 2.0 mm thickness, which reflects the broadband response capability. The analysis reveals that ZSFA-2 has the highest tan δe value (0.35), indicating a strong loss potential and energy conversion capability (FIG. 7 (d)). The excellent MA performance of ZSFA-2 is attributed to its good impedance matching, strong dielectric loss characteristics, and collaboration with $ZnSnO_3$ self-assembly and graphitized fine ash.

In general, the intrinsic conductivity of the synthesized ZSFA composite determines the result of impedance matching of the incident electromagnetic wave with the MA material. It can be known from Equation (1) that an impedance matching ratio Z ($Z=Z_{in}/Z_0$) close to 1 indicates a good matching property, i.e., the incident microwaves can enter the MA system as a whole without reflecting into the contact surface space. The superconductivity of material will cause a skin effect, which is not conducive to electromagnetic wave entering the material. In other words, electromagnetic wave interference shielding materials are prepared from functional materials with ultra-high conductivity instead of MA materials. It is worth noting that the maximum absorption peaks of ZSFA-2 with different thicknesses provide good impedance matching values. The results show that ZSFA-2 has the best electromagnetic parameters and suitable conductivity to obtain good impedance matching and greater loss contribution. Moreover, the maximum RL peaks of ZSFA-2 are shifted from Ku-band to s-band as the thickness increases. This frequency dependence can be explained by the classical quarter-wavelength theory, where the relation between the thickness (tm) and the maximum absorption frequency (m) can be expressed by the following equation:

$$t_m = \frac{nc}{\left(4f_m\sqrt{|\varepsilon_r||\mu_r|}\right)} \quad (n = 1, 3, 5, \ldots) \quad (5)$$

In case that the thickness (tm) and the maximum absorption frequency satisfy the above equation, the incident wave and reflected wave propagate in the absorber space in opposite phases of 180°. Compared with some newly released microwave absorbers with pure dielectric loss mechanism, it can be concluded that ZSFA-2 has a strong reflection loss capability and a wide effective frequency (Table 1). This high-performance microwave absorption capability mainly comes from good impedance matching, optimized electromagnetic parameters and multiple dielectric loss mechanisms, resulting in the final excellent microwave energy absorption.

TABLE 1

Performance comparison between microwave absorber and absorbing materials

| Absorber | $RL_{min}$ (dB) | Thickness (mm) | EABD (GHz) RL ≤ −10 dB | Ref |
|---|---|---|---|---|
| $Fe_3O_4$ @ $SnO_2$/RGO | −45.5 | 4.0 | 3.0 | Literature |
| ZnOnws/RGO foam/PDMS | −27.8 | 4.8 | 4.2 | Literature |
| ZnO/NPC/RGO | −50.5 | 2.4 | 7.4 | Literature |
| RGO/$Fe_3O_4$/ZnO | −57.0 | 2.0 | 5.0 | Literature |
| ZnO-Ni-C/RGO | −59.3 | 2.05 | 5.6 | Literature |
| ZnO @ MWCNTs/$SiO_2$ | −20.7 | 2.5 | 3.4 | Literature |
| $ZnSnO_3$ @ RGO | −53.7 | 1.8 | 5.2 | Literature |
| $ZnSnO_3$/MWCNTs | −52.1 | 1.6 | 3.9 | Literature |
| ZSFA-2 | −47.7 | 2.0 | 7.1 | The work |

To sum up, according to the present invention, a ZnSnO3@ fine ash (ZSFA) absorbing material with a special core-shell structure is successfully prepared by coating the self-assembled ZnSnO3 with highly graphitized fine ash based on the hydrothermal reaction method. The material is a pure dielectric ZSFA composite with an Ostwald ripening process. With the dielectric property and conductivity adjusted, the prepared composite reveals a good impedance matching performance and an improved MA performance. With 50% (wt %) added, the synthesized ZSFA-2 show the strongest dielectric loss capability with a maximum RL value of −47.8 dB at 2.5 mm. The widest effective absorption bandwidth can reach 7.0 GHz, or range from 11.0 GHz to 18.0 GHz when the thickness is only 2.0 mm. The relevant electromagnetic properties and dielectric loss capability are also discussed in detail. Due to strong dielectric polarization and multidielectric polarization, suitable conductivity and special electron migration route of the ZSFA composite, it has a tunable dielectric loss behavior and a broadband MA capability. Therefore, the unique pure dielectric ZSFA composite can be used as a potential functional material in the MA field.

The foregoing is only the preferred embodiments of the present invention and is not for use in limiting the present invention. Therefore, any equivalent substitutions or changes made within the technical scope disclosed herein by a person skilled in the art according to the technical solution and inventive concept of the present invention shall be included in the scope of protection of the present invention.

What is claimed is:

1. A method for preparing a $ZnSnO_3$ composite coated with highly graphitized fine ash, characterized by comprising the following method steps:
   S1: preparing fine ash with gasified fine slag of pulverized coal as a raw material by performing a three-step acidification method;
   S2: adding the fine ash preparing in the S1 into a container filled with distilled water, ultrasonically dispersing for 20-40 min, adding equal molar masses of $SnCl_4·5H_2O$ and $Zn(NO_3)·6H_2O$ respectively, uniform stirring, dropwise adding ammonia into the mixed solution and magnetically stirring until the pH value of the mixed solution is 12, heating the mixed solution, washing the product obtained with deionized water and ethanol 2-4 times, and finally drying to obtain the $ZnSnO_3$ composite coated with highly graphitized fine ash.

2. The method according to claim 1, characterized in that the fine ash in the S1 is prepared in the following method steps:
   S11: with the gasified fine slag of pulverized coal as a raw material, mixing with hydrochloric acid solution in a container, stirring and filtering;
   S12: washing the solid filtered in the S11 to neutral with water, and drying;
   S13: mixing the solid dried in the S12 with hydrofluoric acid solution in a container, stirring, filtering, washing to neutral with water, and drying; and
   S14: mixing the solid dried in the S13 with hydrochloric acid solution in a container, stirring, filtering, washing to neutral with water, and drying to obtain fine ash.

3. The method according to claim 2, characterized in that the concentration of the hydrochloric acid solution is 5 mol/L, and the mass-to-volume ratio of the gasified fine slag to the hydrochloric acid solution is 1 g:(8-12) mL in the S11.

4. The method according to claim 2, characterized in that the mass fraction of the hydrofluoric acid solution is 40%, and the mass-to-volume ratio of the gasified fine slag to the hydrofluoric acid solution is 1 g:(8-12) mL in the S13.

5. The method according to claim 2, characterized in that the mixing temperature is 50-70° C. in the S11, the S13 and the S14.

6. The method according to claim 2, characterized in that the drying condition is drying at 100-110° C. for 10-14 h in the S12, the S13 and the S14.

7. The method according to claim 1, characterized in that the mass molar ratio of the fine ash, $SnCl_4·5H_2O$ and $Zn(NO_3)_2·6H_2O$ is 1 mg:0.0125-0.0375 mol:0.0125-0.0375 mol in the S2.

8. The method according to claim 1, characterized in that the mixed solution is reacted at 140-160° C. for 8-12 h in the S2.

9. The method according to claim 1, characterized in that the drying condition is vacuum drying at 50-70° C. for 10-14 h in the S2.

\* \* \* \* \*